(12) United States Patent
Zhang et al.

(10) Patent No.: US 6,884,727 B2
(45) Date of Patent: Apr. 26, 2005

(54) SEMICONDUCTOR FABRICATION PROCESS FOR MODIFYING THE PROFILES OF PATTERNED FEATURES

(75) Inventors: Da Zhang, Austin, TX (US); Terry G. Sparks, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 8 days.

(21) Appl. No.: 10/224,675

(22) Filed: Aug. 21, 2002

(65) Prior Publication Data

US 2004/0038536 A1 Feb. 26, 2004

(51) Int. Cl.[7] .............................................. H01L 21/311
(52) U.S. Cl. ...................... 438/694; 430/313; 430/314; 430/329
(58) Field of Search ................................ 438/694, 708; 430/329, 330, 314, 316, 323, 296, 325, 328, 394, 942, 313

(56) References Cited

U.S. PATENT DOCUMENTS

| | | | | |
|---|---|---|---|---|
| 3,984,582 A | * | 10/1976 | Feder et al. | 430/296 |
| 6,316,169 B1 | * | 11/2001 | Vahedi et al. | 438/694 |
| 6,645,677 B1 | * | 11/2003 | Sandstrom | 430/323 |
| 6,653,231 B2 | * | 11/2003 | Okoroanyanwu et al. | 438/669 |
| 6,716,570 B2 | * | 4/2004 | Nagarajan et al. | 430/323 |
| 2003/0216051 A1 | * | 11/2003 | Chung et al. | 438/703 |

* cited by examiner

*Primary Examiner*—Asok Kumar Sarkar
(74) *Attorney, Agent, or Firm*—Joseph P. Lally

(57) ABSTRACT

A method for forming a sacrificial layer (30) over patterned structures (28) to allow structures (28) to be trimmed laterally without incurring much loss vertically. Structures (28) are patterned on a first layer (26) of a substrate (24). Thereafter, sacrificial layer (30) is deposited on structures (28). During this deposition, the thickness of sacrificial layer (28) grows vertically above structures (28) faster than it grows laterally adjacent to the structures' sidewalls. Sacrificial layer (30) and patterned structures (28) are then etched where the etch rate uniformity ensures that the sacrificial layer (30) covering the sidewalls is cleared before the sacrificial layer covering the horizontal portions thereby enabling etching of the patterned structure sidewalls without reducing the patterned structure height. The sacrificial layer may comprise a polymer formed with a low energy fluorocarbon plasma while the subsequent etch may employ an oxygen plasma.

16 Claims, 2 Drawing Sheets

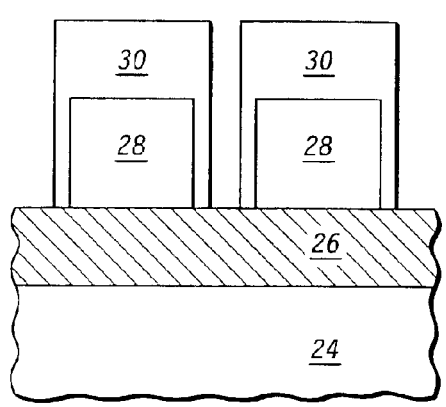
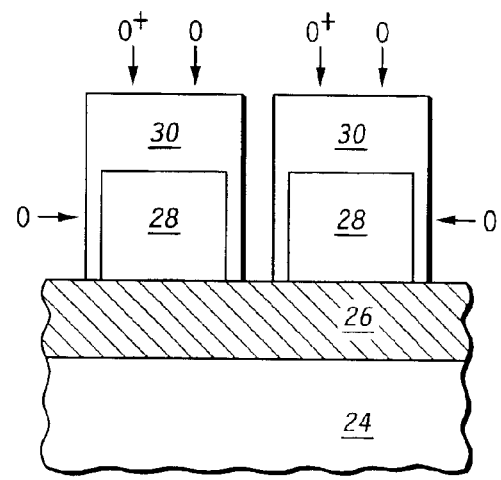
FIG.7  FIG.8
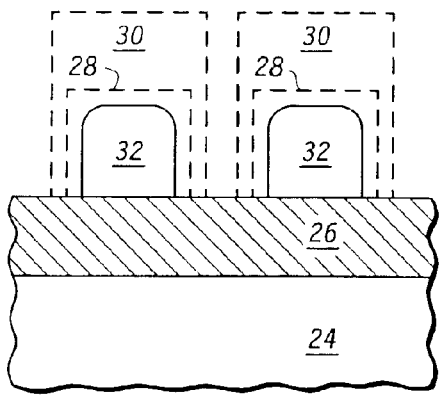
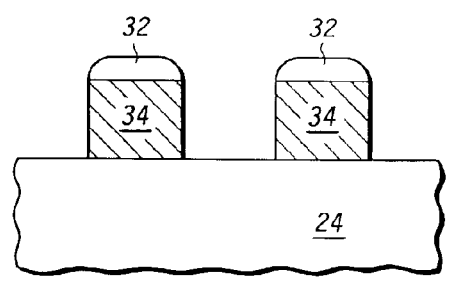
FIG.9  FIG.10

SEMICONDUCTOR FABRICATION PROCESS FOR MODIFYING THE PROFILES OF PATTERNED FEATURES

BACKGROUND OF THE INVENTION

1. Field of the Invention

The present invention relates generally to semiconductor fabrication and, more particularly, to a method for forming a sacrificial polymer upon patterned features to allow those features to be trimmed laterally without incurring much loss vertically.

2. Description of Related Art

The fabrication of an integrated circuit involves numerous processing steps. After impurity regions are formed within a semiconductor substrate and gate conductors are defined upon the substrate, interconnect routing is placed across the substrate and connected to the impurity regions. An inter-level dielectric is formed between the interconnect routing and the substrate to isolate the two levels. Contact openings are formed through the dielectric and filled with a conductive material to electrically link the interconnect routing to select impurity regions in the substrate. Additional levels of interconnect routing separated by interlevel dielectric layers can be formed if desired. Different levels of the interconnect routing can be coupled together with ohmic contacts formed through the dielectric layers. Forming a multi-level integrated circuit in this manner reduces the overall lateral area occupied by the circuit.

Various features of the integrated circuit, e.g., gate conductors, are defined using a technique known as lithography. A photosensitive film, i.e., photoresist, is spin-deposited across a layer of the integrated circuit in which features are to be formed. An optical image is transferred to the photoresist by projecting a form of radiation, typically ultraviolet light, through the transparent portions of a mask plate. A photochemical reaction alters the solubility of the regions of the photoresist exposed to the radiation. The photoresist is washed with a solvent known as a developer to preferentially remove the regions of higher solubility, followed by curing the remaining regions of the photoresist. The portions of the layer below the photoresist which are no longer covered by the photoresist are etched away to define features of the ensuing integrated circuit. The photoresist provides protection for the portions of the layer directly beneath the photoresist from being removed.

Unfortunately, the minimum lateral dimension that can be achieved for a patterned photoresist feature is limited by, among other things, the resolution and the depth-of-focus of the optical system used to project the image onto the photoresist. The term "resolution" describes the ability of an optical system to distinguish closely spaced objects. The term "depth-of-focus" refers to the distance range through which the imaging plane can be moved forward or backward with respect to the optical system while retaining satisfactory sharp focus. In addition, diffraction effects may undesirably occur as the radiation passes through slit-like transparent regions of the mask plate, scattering the radiation and therefore adversely affecting the resolution of the optical system. As such, the photoresist regions exposed to the radiation fail to correspond to the mask plate pattern, resulting in the photoresist features being skewed. In particular, the lithography process limits the minimum achievable widths of and distances between the features of an integrated circuit. This minimum feature size dictates the density and operating speed of the integrated circuit.

Due to the high demand for densely packed integrated circuits which operate at high speeds, the semiconductor industry has developed a trimming process for reducing the lateral widths of the features of a circuit despite the limitation of lithography. FIGS. 1–3 illustrate this trimming process in detail. FIG. 1 depicts an exemplary layer, referred to in this disclosure as polysilicon layer 12, in which features are to be formed. Polysilicon layer 12 is disposed over a semiconductor substrate 10. Although not shown, a gate dielectric would likely be interposed between layer 12 and substrate 10. A photoresist layer 14 is patterned across polysilicon layer 12 via the lithography processing. Subsequently, as shown in FIG. 2, the photoresist layer 14 is subjected to an oxygen plasma to etch photoresist layer 14. As shown in FIG. 3, a photoresist layer 16 is formed which has smaller features than the original photoresist layer 14 formed by lithography (indicated by a dashed line). That is, the features of photoresist layer 16 are smaller in size than the features of photoresist layer 14. This facilitates fabricating devices with smaller critical dimensions and thus better performance. However, there is at least one problem associated with conventional trim processes: Although only lateral photoresist etch is desired, conventional trim processes also etch the photoresist features vertically. If the lateral trimming is too aggressive, a very thin photoresist may result. Consequently, during the subsequent etch of polysilicon layer 12 to define gate conductors therein, the thickness of the overlying photoresist layer 16 is insufficient to protect underlying portions of polysilicon layer 12 from being removed. As a result, the operability of the ensuing integrated circuit is compromised.

One common method employed to overcome this drawback of the trimming process has been to increase the thickness of the initial photoresist layer. However, the lithography process experiences additional problems as a result of increasing the photoresist height. For example, the imaging is blurred when the photoresist thickness exceeds the depth-of-focus of the optical system. Also the amount of ultraviolet light that scatters during penetration of the photoresist increases as the thickness of the photoresist increases, thus adversely affecting the lithography resolution. FIG. 4 depicts another problem known as tilting that can occur during the development of the photoresist. A photoresist layer 22 has been patterned upon a layer 20 disposed above a substrate 18. The photoresist features are tilted such that their vertical surfaces or sidewalls are not perpendicular to the upper surface of layer 20, thus leaving only narrow regions of layer 20 protected by the entire height of the photoresist. In addition to this problem, the photoresist could also experience resist pattern collapse in which the relatively tall features lose adhesion to the underlying layer and thus fall off.

A low initial photoresist height is therefore needed to improve lithography resolution and maintain the mechanical stability of the photoresist once it has been patterned. It would therefore be desirable to develop a method for reducing the size of photoresist features preferentially in the lateral direction, while ensuring that regions of an underlying material covered by the photoresist are protected against being etched.

SUMMARY OF THE INVENTION

The present invention addresses these needs by providing a method for forming a sacrificial polymer preferentially upon the upper or horizontal surfaces of patterned photoresist structures (or features). Due to the presence of the sacrificial polymer, etching of the horizontal surfaces of the photoresist structures is limited. In particular, all of the sacrificial polymer must be etched from above the photoresist structures before the horizontal surfaces of those structures undergo etching. Therefore, very little of the photoresist structure's height is reduced before the desired lateral widths of the structures are achieved. The method hereof thus can be used to trim the lateral widths of the photoresist structures while at the same time maintaining their heights at a sufficient level to ensure that portions of an underlying layer covered by the structures are protected from being etched.

According to an embodiment of the invention, a method for forming an integrated circuit includes patterning photoresist structures upon a first layer of a semiconductor topography, followed by depositing a polymer layer on the patterned photoresist structures. The polymer layer is preferably deposited from a fluorocarbon-containing plasma in which the ions have an low energy, usually less than about 70 eV and preferably less than about 30 eV. During this deposition, the thickness of the polymer grows vertically above the photoresist structures faster than it grows laterally adjacent to the sidewalls of the structures.

The method further includes etching the polymer layer and the patterned photoresist structures to reduce the lateral widths of the photoresist structures. The etching step is preferably performed using an oxygen-containing plasma. The horizontal surfaces of the photoresist structures do not undergo etching until the entire thickness of the polymer layer above the structures has been removed. Subsequent to this etching step, regions of the first layer remaining exposed by the patterned photoresist structures are also etched away. The photoresist structures are sufficiently thick to inhibit underlying areas of the first layer from being removed. Other steps for completing the integrated circuit would be obvious to one skilled in the art.

BRIEF DESCRIPTION OF THE DRAWINGS

The invention, together with further advantages thereof, may best be understood by reference to the following description taken in conjunction with the accompanying drawings in which:

FIG. 7 is a cross-sectional view of the semiconductor topography depicted in FIG. 6, wherein a fluorocarbon polymer is deposited upon the surfaces of the photoresist layer as a result exposing the photoresist layer to the fluorocarbon-containing plasma;

FIG. 8 is a cross-sectional view of the semiconductor topography depicted in FIG. 7, wherein the photoresist layer and the polymer are etched using an oxygen-containing plasma;

FIG. 9 is a cross-sectional view of the semiconductor topography depicted in FIG. 8, wherein the polymer is removed and the lateral widths of the features in the photoresist layer are reduced as a result of the etching step; and FIG. 10 is a cross-sectional view of the semiconductor topography depicted in FIG. 9, wherein the photoresist layer serves as an etching mask while exposed regions of the polysilicon layer are removed to define gate conductors.

DETAILED DESCRIPTION OF THE PREFERRED EMBODIMENTS

Reference will now be made in detail to the presently preferred embodiments of the invention, examples of which are illustrated in the accompanying drawings. It should be noted that the drawings are in simplified form and are not to precise scale. Although the invention herein refers to certain illustrated embodiments, it is to be understood that these embodiments are presented by way of example and not by way of limitation. The intent of the following detailed description is to cover all modifications, alternatives, and equivalents as may fall within the spirit and scope of the invention as defined by the appended claims.

It is to be understood and appreciated that the process steps and structures described herein do not cover a complete process flow for the manufacture of an integrated circuit. The present invention may be practiced in conjunction with various integrated circuit fabrication techniques that are conventionally used in the art, and only so much of the commonly practiced process steps are included herein as are necessary to provide an understanding of the present invention.

Figure 1:
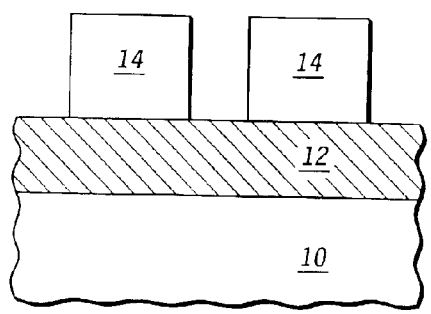
FIG. 1 is a cross-sectional view of a semiconductor topography formed in accordance with a conventional method, wherein a photoresist layer is patterned across a polysilicon layer disposed upon a substrate.
Figure 2:
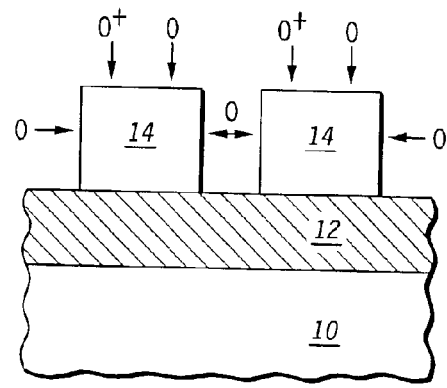
FIG. 2 is a cross-sectional view of the semiconductor topography depicted in FIG. 1, wherein the photoresist layer is etched using an oxygen-containing plasma.
Figure 3:
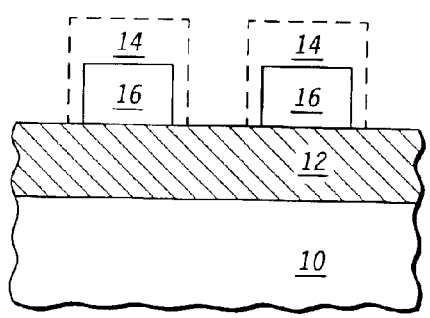
FIG. 3 is a cross-sectional view of the semiconductor topography depicted in FIG. 2, wherein the lateral and vertical size of the features of the photoresist layer are reduced as a result of the etching of the photoresist layer.
Figure 4:
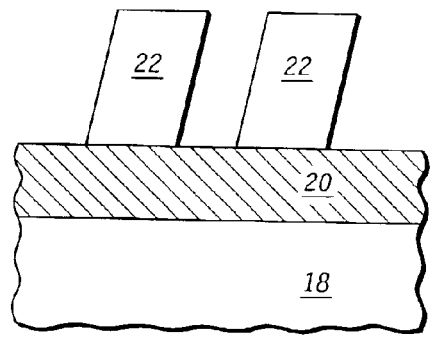
FIG. 4 is a cross-sectional view of a semiconductor topography formed in accordance with a conventional method, wherein the height of the photoresist layer formed across the polysilicon layer is increased, causing the features of the photoresist layer to become tilted during lithography.
Figure 5:
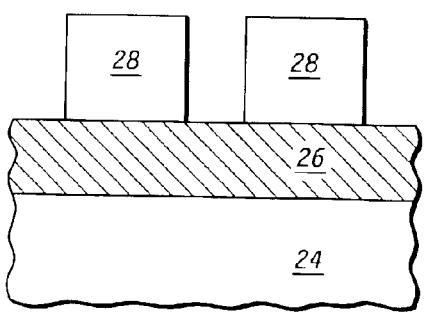
FIG. 5 is a cross-sectional view of a semiconductor topography formed in accordance with a preferred embodiment of the present invention, wherein a photoresist layer is patterned across a polysilicon layer disposed upon a substrate.

Referring more particularly to the drawings, FIGS. 5–10 illustrate a method for forming an integrated circuit in accordance with a preferred embodiment of the invention. As shown in FIG. 5, a substrate 24 is provided that preferably comprises single crystalline silicon. Alternatively, substrate 24 could comprise materials such as gallium nitride (GaN), gallium arsenide (GaAs), polysilicon, or other materials commonly recognized as suitable semiconductor materials to those skilled in the art. Substrate 24 may be slightly doped with p-type dopants (e.g., arsenic, phosphorus, and antimony) or n-type dopants (e.g., boron and boron difluoride), and it may include oppositely doped impurity regions (also called junctions). A first layer 26 comprising, e.g., polysilicon, is formed over a substrate 24 using, e.g., chemical vapor deposition (CVD) from a silane ($SiH_4$) source. Although not shown, a gate dielectric comprising, e.g., silicon dioxide ($SiO_2$) may be interposed between substrate 24 and first layer 26, assuming that first layer 26 is later formed into gate conductors. It is to be understood that first layer 26 represents any layer of an integrated circuit in which features are to be formed and that first layer 26 may comprise a conductive, semi-conductive, or insulating material. Similarly, there may be one or any number of layers between first layer 26 and substrate 24.

A patterned photoresist layer 28 is formed on first layer 26 using lithography. As is common in the art, a layer of photoresist is first spin-deposited across a wafer containing the semiconductor topography. Preferably, the photoresist is sufficiently thin to avoid mechanical problems such as tilting and fall-off during later processing steps. The wafer is then placed into a patterning tool known as a "stepper" where it is aligned to a mask plate and exposed to ultraviolet (UV) radiation. The mask may only be large enough to cover a small portion of the wafer, in which case the stepper steps the wafer through many quadrants, each of them being exposed in turn until the entire or desired portion of the wafer has been exposed to UV light. Depending upon whether positive or negative photoresist is used, the UV-exposed or non-UV-exposed portions of the photoresist become soluble in a developer solution. The wafer is then placed in a developer solution for dissolving the portions of the photoresist that are soluble, thereby yielding patterned photoresist layer 28. Drawbacks of the previously discussed lithography process limit the minimum lateral dimensions that can be achieved for the features of photoresist layer 28.

Figure 6:
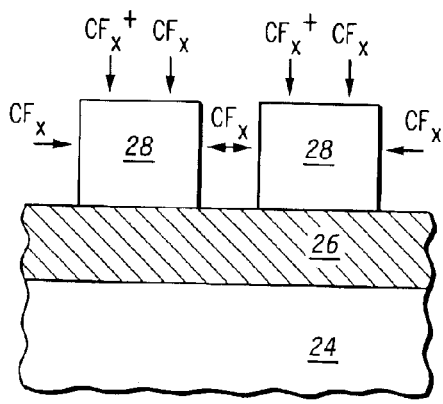
FIG. 6 is a cross-sectional view of the semiconductor topography depicted in FIG. 5, wherein the photoresist layer is exposed to a fluorocarbon-containing plasma comprising low energy ions and radicals.

Turning to FIG. 6, the wafer is next subjected to a polymerization process in which a fluorocarbon-containing plasma is created in a vacuum chamber. The preferred gas from which the plasma is created contains $C_xF_y$ (e.g., $C_4F_8$) and, optionally, an inert carrier gas such as Ar. The polymerization is controlled using wafer bias to provide low ion energy of less than about 70 eV, and preferably less than about 30 eV. The $CF_x^+$ ions present in the plasma move anisotropically (i.e., movement in the vertical direction is greater than that in the horizontal direction) and thus strike the horizontal surface of photoresist layer 28 (as well as exposed portions of substrate 26). These low energy ions stick to and polymerize on the photoresist layer horizontal surfaces. Moreover, the low energy associated with the polymerization plasma beneficially minimizes any undesirable effects that the plasma might otherwise have on the exposed portion of the substrate. The plasma also contains neutral $CF_x$ radicals that travel isotropically (i.e., movement in the horizontal direction equals movement in the vertical direction). The $CF_x$ radicals stick to and are polymerized on both the sidewall and the horizontal surfaces of the photoresist layer 28. However, the polymerization rate at the horizontal surface is faster. This is because the low energy ions activate surface sites at the horizontal surface of photoresist layer 28, thus creating dangling bonds to induce higher sticking probabilities for the neutral $CF_x$ radicals on the horizontal surface. Accordingly, the polymerization process is characterized by a differential between the polymerization rate on horizontal surfaces of the photoresist layer and the polymerization rate on vertical surfaces where the horizontal surface deposition rate is greater than the vertical surface deposition rate.

As shown in FIG. 7, a sacrificial layer in the form of fluorocarbon polymer 30 is thus formed non-uniformly on photoresist layer 28. Due to more polymerization sources and faster polymerization rates on the horizontal surface of photoresist layer 28, a thicker layer of polymer 30 is formed on the horizontal surfaces of photoresist layer 28 than on the sidewall or vertical surfaces. Additional literature related to the polymerization properties of fluorocarbon plasmas can be found in D. Zhang, and M. J. Kushner, J. Vac. Sci. Technol. A 19(2), 524 (2001).

Subsequently, as depicted in FIG. 8, an etching environment, preferably an $O_2$-containing plasma, is employed to etch polymer 30 and photoresist layer 28. Preferably, the etch is performed using an $O_2$/HBr/Ar plasma; however, a plasma containing an $O_2$/Ar mixture or only $O_2$ may optionally be used. In one embodiment, the oxygen-containing plasma is controlled to produce an isotropic etch environment that etches the polymer layer/photoresist structure substantially uniformly in both lateral and vertical directions. In other embodiments, a bias may be applied during the etch to obtain a slightly anisotropic etch environment in which the etch rate of the horizontal surfaces is greater than the etch rate at the vertical surfaces. In the anisotropic etch embodiment, it is important to maintain the differential etch rate (the difference between the etch rates on horizontal surfaces and sidewalls) below the differential polymerization rate that was produced during the polymerization plasma process. In the isotropic etch embodiment, of course, the differential etch rate is approximately zero. Because polymer 30 is thinner on the vertical surfaces, the etch will reach the vertical surfaces (sidewalls) of photoresist layer 28 before it reaches the photoresist horizontal surfaces. In other words, the etch uniformity is sufficient to remove the vertical portions of polymer 30 before removing the horizontal portions of polymer 30. Accordingly, the etch will reach the sidewalls of photoresist layer 28 before reaching the photoresist layer horizontal surfaces.

As illustrated in FIG. 9, the etch duration is selected to terminate after reducing the lateral widths of the structures in the original photoresist layer 28 (indicated by a dashed line) to their desired sizes, thereby forming relatively narrow "post-plasma" photoresist structures 32. The original profile of polymer 30 (indicated by a dashed line) above horizontal surfaces of photoresist layer 28 is sufficient to ensure that the vertical dimension or height of photoresist structure 32 is maintained at a sufficient level to protect underlying regions of first layer 26 from later being etched. As such, the height of post-plasma photoresist structures 32 is only slightly less than the height of the structures in the original photoresist layer 28.

Turning to FIG. 10, the regions of first layer 26 left exposed by photoresist structures 32 are subsequently etched using, e.g., an anisotropic plasma etch. Any suitable etch chemistry for removing the material in first layer 26 may be employed. Photoresist structures 32 may be eroded vertically during the etching of layer 26 as shown. However, the vertical dimension or thickness of post-plasma photoresist structures 32 is sufficient to substantially inhibit underlying regions of first layer 26 from being removed. In this manner, laterally spaced features 34, e.g., gate conductors, are defined above substrate 24. The lateral widths of features 34 are substantially equivalent to the lateral widths of post-plasma photoresist structures 32, which are smaller than the lateral widths of the initial photoresist structures 28. The resulting wafer may subsequently be placed in a chemical bath solution or a dry photoresist ashing tool for removing photoresist structures 32.

In one embodiment of the invention, it may be beneficial to repetitively perform the polymerization plasma/photoresist etch sequence described above with reference to FIGS. 6 through 8 before etching the first layer 26. In this embodiment, each iteration of the polymerization plasma/photoresist etch sequence reduces the horizontal dimension of the photoresist structures incrementally. This embodiment might be required or preferable when the spacing between adjacent photoresist structures is too close to permit the amount of sidewall polymerization that would be required to achieve the desired reduction in photoresist structure in a single etch step.

In another embodiment of the invention, the polymerization and photoresist etch processes may be incorporated into a single plasma step. This embodiment can be achieved by using a plasma containing both oxygen and fluorocarbon gases and with low ion energy. In one implementation of this embodiment, the low energy fluorocarbon plasma is introduced into the plasma chamber first to form an initial polymer layer. After the initial polymer layer is formed, the oxygen plasma can be introduced into the chamber to initiate the polymer/photoresist etch. As long as the differential polymerization rate attributable to the fluorocarbon component is greater than the differential etch rate attributable to the oxygen component, the vertical surfaces of the photoresist layer will be protected by polymer film thereby preventing significant horizontal etching.

It is to be understood that the process of the present invention is not limited to reducing the size of photoresist. The invention also covers trimming features of other materials such as a $Si_3N_4$ hard mask. For example, a hard mask may be trimmed in a manner similar to photoresist trimming. That is, a polymerization process is applied to preferentially deposit polymer on the horizontal surface of the hardmask. Then an etching process is applied to reduce the lateral size of the hardmask features. The polymer protection from the top leads to very small loss of the vertical dimension of the initial hardmask features.

What is claimed is:

1. A method for forming an integrated circuit on a semiconductor wafer, comprising:

forming a patterned structure having horizontal surfaces and vertical surfaces over a first layer of a substrate of the wafer;

depositing a polymer layer on the patterned structure wherein the thickness of the polymer layer on the horizontal surfaces is substantially uniform and greater than its substantially uniform thickness on the vertical surfaces; and etching the polymer layer and patterned structure with an etch uniformity sufficient to remove vertical portions of the polymer layer and etch vertical surfaces of the patterned structure before etching horizontal surfaces of the patterned structure.

2. The method of claim 1, wherein said forming of the polymer layer and said etching of the polymer layer and patterned structure are performed concurrently using a plasma comprising fluorocarbon and oxygen gases.

3. The method of claim 1, wherein said the width of the patterned structure is reduced by the etching of the polymer layer and the patterned structure while the height of the patterned structure is substantially undiminished.

4. The method of claim 1, further comprising etching away regions of the first layer remaining exposed by the patterned structure subsequent to etching the polymer layer and the patterned structure.

5. The method of claim 1, wherein the patterned structure is a photoresist structure or a hard mask structure comprising silicon nitride.

6. A method for forming an integrated circuit on a semiconductor wafer, comprising:

forming a patterned structure having horizontal surfaces and vertical surfaces over a first layer of a substrate of the wafer;

non-uniformly depositing a polymer layer on the patterned structure wherein the thickness of the polymer layer on the horizontal surfaces is greater than its thickness on the vertical surfaces;

etching the polymer layer and patterned structure with an etch uniformity sufficient to remove vertical portions of the polymer layer and etch vertical surfaces of the patterned structure before etching horizontal surfaces of the patterned structure; and repeating said forming of the polymer layer and said etching of the polymer layer and patterned structure one or more times, wherein each iteration removes an incremental portion of the patterned structure vertical surfaces.

7. A method for forming an integrated circuit on a semiconductor wafer, comprising:

forming a patterned structure having horizontal surfaces and vertical surfaces over a first layer of a substrate of the wafer;

non-uniformly depositing a polymer layer on the patterned structure wherein the thickness of the polymer layer on the horizontal surfaces is greater than its thickness on the vertical surfaces; and etching the polymer layer and patterned structure with an etch uniformity sufficient to remove vertical portions of the polymer layer and etch vertical surfaces of the patterned structure before etching horizontal surfaces of the patterned structure;

wherein said forming of the polymer layer comprises forming a fluorocarbon polymer by exposing the wafer to a fluorocarbon-containing plasma; and wherein ions in the plasma have an energy of less than about 70 eV.

8. The method of claim 7, wherein ions in the plasma have an energy of less than about 30 eV.

9. The method of claim 7, wherein the etching of the polymer layer and the patterned structure comprises exposing the wafer to an oxygen-containing plasma.

10. The method of claim 7, wherein the etching of the polymer layer and the patterned structure comprises exposing the wafer to a plasma comprising $O_2$, HBr, and Ar.

11. A method of forming an integrated circuit on a semiconductor wafer, comprising:

forming a patterned structure having horizontal surfaces and vertical surfaces over a first layer of the wafer;

depositing a sacrificial layer over the patterned structure wherein a portion of the sacrificial layer overlying the patterned structure's vertical services has a uniform first thickness and wherein the portion of the sacrificial layer adjacent the patterned structures horizontal surfaces has substantially uniform second thickness, wherein the first thickness is less than the second thickness;

removing portions of the sacrificial layer over the patterned structure's vertical surfaces to expose the vertical surfaces while retaining at least some of the sacrificial layer over horizontal portions of the patterned structure; and etching the exposed vertical surfaces of the patterned structures to reduce the lateral width of the structures without substantially reducing the vertical height of the structures.

12. The method of claim 11, wherein the patterned structure comprises photoresist and wherein depositing the sacrificial layer comprises forming a polymer layer over the patterned structure.

13. The method of claim 12, wherein forming the polymer layer comprises exposing the wafer to a fluorocarbon plasma at an energy of less than approximately 30 eV.

14. The method of claim 13, wherein removing portion of the sacrificial layer comprises exposing the wafer to an oxygen plasma.

15. The method of claim 11, wherein depositing the sacrificial layer comprises depositing the sacrificial preferentially on the patterned structure horizontal surfaces wherein a thickness of the sacrificial layer over the patterned structure horizontal surfaces is greater than a thickness of the sacrificial layer over the patterned structure vertical surfaces.

16. The method of claim 15, wherein removing portions of the sacrificial layer comprises etching the sacrificial layer wherein the etch rate uniformity is sufficient to clear portions of the sacrificial layer over the vertical surfaces before clearing sacrificial layer portions of the horizontal surfaces.

* * * * *